United States Patent
Mayer et al.

(10) Patent No.: US 11,047,686 B2
(45) Date of Patent: Jun. 29, 2021

(54) SYSTEM FOR DIGITAL CANCELLATION OF CLOCK JITTER INDUCED NOISE IN A GYROSCOPE WITH PROVIDES BETTER POWER EFFECT

(71) Applicant: Robert Bosch GmbH, Stuttgart (DE)

(72) Inventors: Thomas Mayer, Palo Alto, CA (US); Chinwuba Ezekwe, Albany, CA (US)

(73) Assignee: Robert Bosch GmbH, Stuttgart (DE)

( * ) Notice: Subject to any disclaimer, the term of this patent is extended or adjusted under 35 U.S.C. 154(b) by 295 days.

(21) Appl. No.: 16/255,223

(22) Filed: Jan. 23, 2019

(65) Prior Publication Data

US 2020/0003560 A1 Jan. 2, 2020

Related U.S. Application Data

(60) Provisional application No. 62/691,576, filed on Jun. 28, 2018.

(51) Int. Cl.
*G01C 19/5776* (2012.01)
*H03L 7/099* (2006.01)
*H03M 3/00* (2006.01)

(52) U.S. Cl.
CPC ........ *G01C 19/5776* (2013.01); *H03L 7/0991* (2013.01); *H03M 3/462* (2013.01)

(58) Field of Classification Search
None
See application file for complete search history.

(56) References Cited

U.S. PATENT DOCUMENTS

| 6,091,684 | A  | * | 7/2000 | Schell | G11B 5/09 369/53.3 |
| 8,184,389 | B2 | * | 5/2012 | Finamore | G11B 5/596 360/39 |
| 9,374,068 | B2 | * | 6/2016 | Schoenknecht | H03K 3/012 |
| 2007/0182459 | A1 | * | 8/2007 | Rees | H02M 1/08 327/78 |
| 2011/0192226 | A1 | * | 8/2011 | Hayner | G01C 19/5776 73/504.12 |

* cited by examiner

*Primary Examiner* — Lisa M Caputo
*Assistant Examiner* — Nigel H Plumb
(74) *Attorney, Agent, or Firm* — Maginot, Moore & Beck LLP

(57) ABSTRACT

In a digital gyroscope, the rate signal (including the quadrature) and the displacement signal of the drive part are sampled with an ADC. This displacement signal has the same frequency and phase as the quadrature signal that gets sampled in the rate channels. The displacement signal is sampled with the same clock as the rate signal resulting in the displacement signal having the same close-in phase noise folded into the signal band as the sampled quadrature in the rate signal. The sampled drive signal is subtracted from the sampled rate signal to eliminate the clock jitter induced noise in the rate signal. This relaxes the close-in phase noise requirement of the PLL and allows for a low power PLL implementation.

12 Claims, 3 Drawing Sheets

SYSTEM FOR DIGITAL CANCELLATION OF CLOCK JITTER INDUCED NOISE IN A GYROSCOPE WITH PROVIDES BETTER POWER EFFECT

CROSS-REFERENCE TO RELATED APPLICATIONS

This application claims priority to U.S. Provisional Application Ser. No. 62/691,576 entitled "DIGITAL CANCELATION OF CLOCK JITTER INDUCED NOISE" by Mayer et al., filed Jun. 28, 2018, the disclosure of which is hereby incorporated herein by reference in its entirety.

TECHNICAL FIELD

This disclosure relates generally to gyroscopic sensors and, more particularly, to circuits for correcting error in an output signal from a gyroscopic sensor.

BACKGROUND

Gyroscopes are often used for sensing a rotation or an attitude of an object along one or more axes of rotation. For example, gyroscopes have long been used in naval vessels, aircraft, and spacecraft to identify rotation of the craft and for use in stability control systems. More recently, gyroscopes have been incorporated in micro-electromechanical (MEMs) devices. While classical gyroscopes rotate around an axis, MEMS gyroscopes typically include vibrating elements that are formed using photolithographic processes in an integrated circuit that is suitable for mounting to a printed circuit board or with other electronic components. As the MEMS device rotates around an axis, the plane of oscillation for the vibrating element tends to remain constant, and a modulated electrical signal from the MEMS sensor corresponds to the attitude of the support for the MEMS device around the axis. Some MEMS devices include multiple vibrating gyroscope elements that enable sensing of rotation along multiple axes in a three-dimensional space For the continued expansion of gyroscopes into more demanding CE applications, a move to smaller process nodes for the ASIC implementation and a shift to more digital centric designs can be observed. An efficient way to implement the shift to more digital is to digitize the signals coming from the gyroscope right at the beginning.

The output of a vibratory MEMS gyroscope has two main signal components. The desired so-called rate signal and the so-called quadrature signal. The latter is an unwanted error signal that has the same frequency but 90° phase shift compared to the rate signal. This quadrature signal can be several factors larger than the full scale rate signal that needs to be measured by the system.

Since the quadrature signal has the same frequency as the rate signal the sampling of the quadrature signal will fold the close-in phase noise of the oscillator into the signal band and therefore degrade the noise performance of the system. The larger the quadrature the larger the noise penalty.

Due to the large quadrature signals of today's MEMS gyroscopes, the direct sampling of the gyroscope output requires a clock signal with very small clock jitter in order to avoid noise folding of that jitter in the presence of a large quadrature signal.

DETAILED DESCRIPTION

Figure 1:
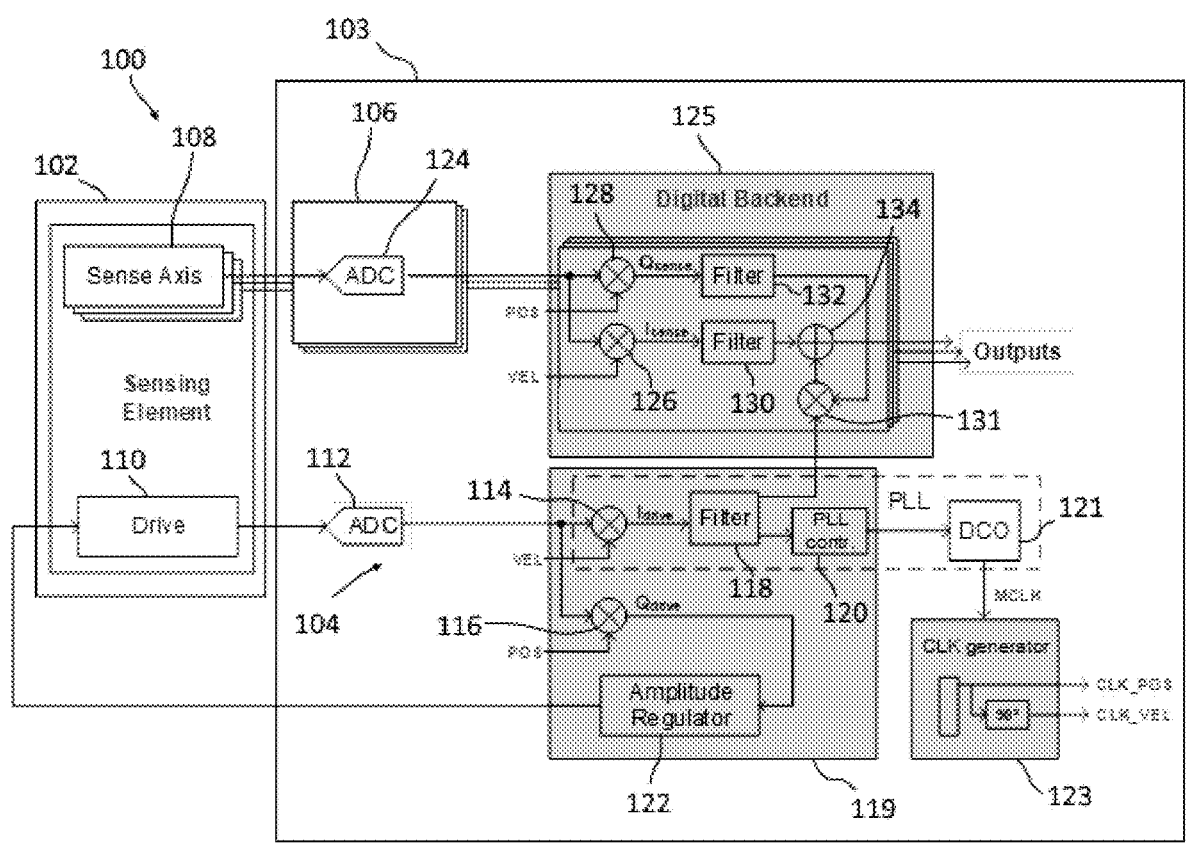
FIG. 1 depicts a first embodiment of a circuit for canceling clock jitter induced noise in a digital gyroscope.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

As used herein, the term in-phase signal refers to a signal from a sensor, such as a gyroscope sensor, that carries information from the sensor corresponding to a property that the sensor measures during operation. For example, the in-phase signal from a vibratory gyroscope is a modulated signal that corresponds to a motion of a vibrating element in the gyroscope sensor.

As used herein, the term quadrature-signal refers to another signal from the sensor that has a quadrature phase (90° phase offset) from the in-phase signal. The quadrature-phase signal is also referred to as a quadrature error signal. Ideally, the in-phase signal is completely separated from the quadrature-phase signal. However, in practical circuits, the phase-offset error can make measurement of only the in-phase signal difficult.

In a highly digital gyroscope not only the rate signal (including the quadrature) but also the displacement signal of the drive part is sampled with an ADC. This displacement signal has the same frequency and phase as the quadrature signal that gets sampled in the rate channels. Since the drive signal is sampled with the same clock, the sampled drive signal will have the same close-in phase noise folded into the signal band as the sampled quadrature in the rate signal. Therefore we can subtract the sampled drive signal from the sampled rate signal to eliminate the clock jitter induced noise in the rate signal. The advantage of this technique is that it relaxes the close-in phase noise requirement of the PLL, since it can eliminate this noise in the digital backend, and therefore allows for a low power PLL implementation.

In contrast to building a very low noise oscillator that puts high restrictions on the power and noise trade off, the technique presented here allows to cancel the clock-jitter-induced noise later on in the digital part. Therefore the noise requirement for the oscillator becomes less stringent and a much better power and noise trade off can be achieved.

FIG. 1 is a schematic diagram of one embodiment of an open-loop gyroscope circuit 100 that is configured to cancel clock jitter induced noise from the output signal. The circuit 100 includes a gyroscope 102 and an integrated circuit 103, such as an application-specific integrated circuit (ASIC). The gyroscope 102 includes at least one sensing element 108 for sensing along at least one axis. The gyroscope 102 may include three sensing elements 108 for sensing along the three axes (e.g., x, y, z). The gyroscope also includes at least one drive axis 110.

In the circuit 100, the gyroscope 102 is a vibratory gyroscope such as a MEMS gyroscope that is used in mobile electronic devices or any other suitable vibratory gyroscope. The sensing elements 108 sense rotation about three sensing axes, each of which is configured to generate a signal corresponding to the motion of a vibrating element and corresponding rotation of the gyroscope along each of an x, y, and z axis, respectively. The x, y, and z axes correspond to three orthogonal axes of rotation in the physical world. In another embodiment, the gyroscope includes only one axis or a different configuration of multiple sensing elements that are arranged on multiple axes.

In FIG. 1, the ASIC 103 includes sensing channels 106, a drive channel 104, and digital processors 119, 125. A separate sensing channel 106 is electrically connected to the output of each sensing axis 108. Each sensing channel 106 includes an analog-to-digital converter (ADC) 124 and a digital processor 125 (i.e., digital backend). The digital processors 119, 125 is embodied as a microprocessor, microcontroller, digital signal processor (DSP), application specific integrated circuit (ASIC), field programmable gate array (FPGA), or any other digital processing device. The digital processor 125 is configured to implement a digital in-phase demodulator 126, a digital quadrature-phase demodulator 128, and filters 130, 132 for the demodulators.

The in-phase demodulator 126 generates a demodulated signal corresponding to the in-phase component ($I_{sense}$) of the digitized output signal from the associated sense channel 106 via the ADC 124. The quadrature-phase demodulator 128 generates a demodulated signal corresponding to the quadrature-phase component ($Q_{sense}$) of the digitized output signal from the ADC 124. The digital processor 125 applies at least one filter 130 filter, e.g., low-pass filter, to the in-phase signal ($I_{sense}$) from the in-phase demodulator 126 and at least one filter 132, e.g., low-pass filter, to the quadrature-phase signal ($Q_{sense}$) from the quadrature-phase demodulator 128.

The drive axis 110 receives a drive signal that generates oscillation in the vibrating members of each of the sensing axes 108. The drive axis 110 drives the sense mass at a predetermined frequency to enable each of the sense axes 108 to oscillate at a predetermined frequency. The drive channel 104 is connected to the output of the drive axis 110. The drive channel 104 includes an ADC 112, a digital in-phase demodulator 114 for demodulating an in-phase component ($I_{drive}$) of the drive signal, a digital quadrature-phase demodulator 116 for demodulating a quadrature-phase component ($Q_{drive}$) of the drive signal, and at least one filter 118, e.g., low-pass filter, for filtering the in-phase component $I_{drive}$ of the drive signal.

The drive channel 104 may also include a phase-locked loop (PLL) controller 120 and an amplitude regulator 122. The output of the quadrature-phase demodulator 116 ($Q_{drive}$) is received by the amplitude regulator 122. The amplitude regulator 122 generates the drive signal that is fed back to the drive axis 110. The amplitude regulator 122 controls the amplitude of the drive signal to maintain the amplitude of the oscillation for the gyroscope 102 at a predetermined level. The demodulators 114, 116 and filter(s) 118 may be implemented by the digital processor.

The PLL controller 120 receives the filtered in-phase component ($I_{drive}$) of the drive signal from the filter 118 and generates a clock control signal that is supplied to a digital controlled oscillator (DCO) 121. The DCO 121 outputs a clock signal based on the clock control signal to a demodulation clock signal generator 123 which generates demodulation clock signals for the I/O demodulators 114, 116, 126, 128.

To cancel the clock jitter induced noise, the filtered in-phase component ($I_{drive}$) of the drive signal from filter 118 and the filtered in-phase component ($I_{sense}$) of the rate signal from filter 130 are supplied as inputs to a digital adder/subtractor 134 where the digital in-phase drive signal ($I_{drive}$) is subtracted from the digital in-phase rate signal $I_{sense}$ to cancel the clock jitter induced noise from the rate signal. Prior to reaching the adder/subtractor 134, the in-phase component ($I_{drive}$) of the drive signal may be scaled by a scaling factor at multiplier 131. The scaling factor is set by the output of the quadrature-phase demodulator 128 which is supplied to the multiplier 131 after being filtered by at least one filter 132, e.g., low-pass filter. The output of the digital adder/subtractor 134 is the output signal for the associated sense axis of the gyroscope.

Figure 2:
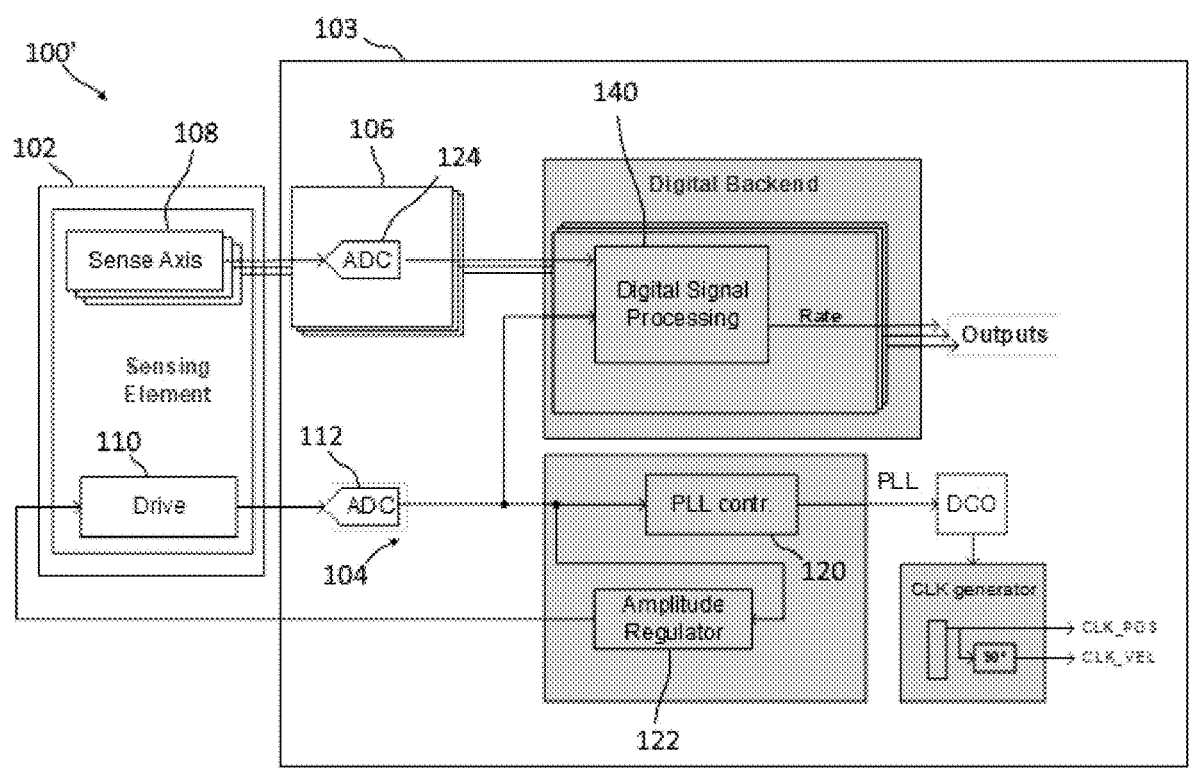
FIG. 2 depicts a second embodiment of a circuit for canceling clock jitter induced noise in a digital gyroscope.

FIG. 2 depicts another embodiment of an open-loop gyroscope readout circuit 100' that is configured to cancel clock jitter induced noise in a digital gyroscope. FIG. 2 represents a more general solution to the problem of canceling clock jitter induced noise. In FIG. 2, the circuit 100' includes a gyroscope 102 and an ASIC 103 with at least one drive channel 104, and at least one sense channel 106. In the embodiment of FIG. 2, the drive channel 104 includes an ADC 112, a digital PLL controller 120 and a digital amplitude regulator 122. The at least one sense channel 106 includes an ADC 124 and digital signal processing 140. In this embodiment, the backend digital signal processing 140 is configured to subtract the sampled drive signal from the sampled rate signal to eliminate the clock jitter induced noise in the rate signal.

Figure 3:
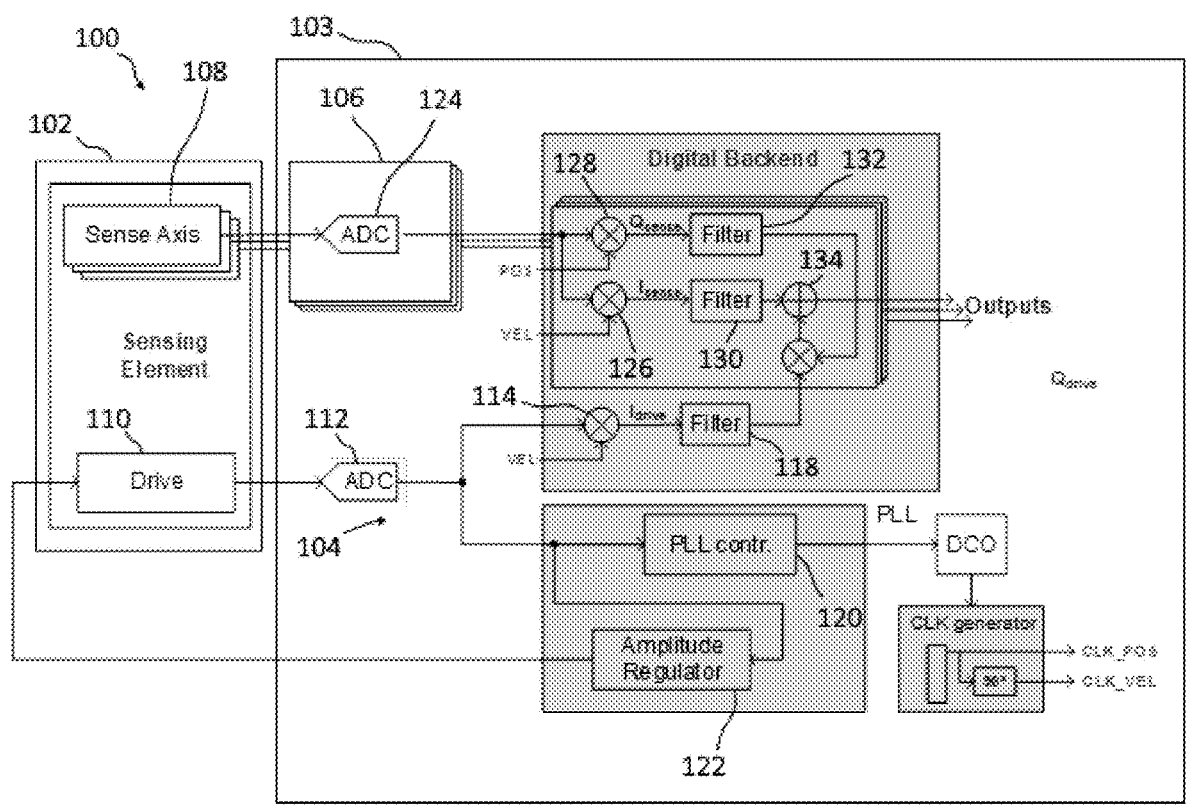
FIG. 3 depicts a third embodiment of a circuit for canceling clock jitter induced noise in a digital gyroscope.

The embodiment of FIG. 3 is similar to the embodiment of FIG. 1 except the quadrature phase demodulator 114 and filter 118 for the in-phase drive signal $I_{drive}$ are incorporated into the digital processing circuits for the sense channel. In the embodiments described above, the sense and drive ADCs may be realized by delta-sigma modulators. In addition, in the embodiments described above, the digital filters may be realized by decimation filters.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A system for processing signals from a gyroscope, comprising:
   at least one drive channel configured to receive an output of a drive axis of the gyroscope, the at least one drive channel including:
      a drive channel analog-to-digital converter (ADC) that receives a drive signal from the drive channel and outputs a digitized drive signal;
      a drive channel in-phase demodulator that receives the digitized drive signal and generates an in-phase demodulated drive signal;
      at least one drive channel filter that receives the in-phase demodulated drive signal and outputs a filtered in-phase demodulated drive signal; and
      a phase-locked loop (PLL);
   a sense channel configured to receive an output of a sensing axis of the gyroscope, the sense channel including:
      a sense channel ADC that receives an analog rate signal from the sense channel and outputs a digitized rate signal; and
      a digital signal processor including:
         a sense channel in-phase demodulator that receives the digitized rate signal and generates an in-phase demodulated rate signal;

a sense channel quadrature-phase demodulator that receives the digitized rate signal and generates a quadrature-phase demodulated rate signal;
a first sense channel filter that receives the in-phase demodulated rate signal and outputs a filtered in-phase demodulated rate signal; and
a second sense channel filter that receives the quadrature-phase demodulated rate signal and outputs a filtered quadrature-phase demodulated rate signal; and
a digital subtraction circuit that subtracts the filtered in-phase demodulated drive signal from the filtered in-phase demodulated rate signal to generate a sense axis output signal.

2. The system of claim 1, wherein the sense channel ADC and the drive channel ADC are realized by delta-sigma modulators.

3. The system of claim 1, wherein the at least one drive channel filter, the first sense channel filter and the second sense channel filter are realized by decimation filters.

4. The system of claim 1, wherein the PLL includes a PLL controller and an amplitude regulator, and
wherein the PLL controller receives the filtered in-phase demodulated drive signal and outputs a clock control signal.

5. The system of claim 4, wherein the drive channel further comprises a drive channel quadrature-phase demodulator that receives the digitized drive signal and generates a quadrature-phase demodulated drive signal.

6. The system of claim 5, wherein the amplitude regulator receives the quadrature-phase demodulated drive signal and outputs the drive signal to the drive axis.

7. The system of claim 1, wherein the filtered in-phase demodulated drive signal is multiplied by a scaling factor at a multiplier circuit before being supplied to the digital subtraction circuit, the scaling factor being dependent upon the quadrature-phase demodulated rate signal.

8. The system of claim 1, wherein the drive channel in-phase demodulator and the at least one drive channel filter are implemented by the PLL.

9. The system of claim 1, wherein the drive channel in-phase demodulator and the at least one drive channel filter are implemented by the digital signal processor.

10. A system for processing signals from a gyroscope, comprising:
at least one drive channel configured to receive an output of a drive axis of the gyroscope, the at least one drive channel including:
a drive channel analog-to-digital converter (ADC) that receives a drive signal from the drive channel and outputs a digitized drive signal; and
a phase-locked loop (PLL) that receives the digitized drive signal from the drive channel ADC; and
a sense channel configured to receive an output of a sensing axis of the gyroscope, the sense channel including:
a sense channel ADC that receives an analog rate signal from the sense channel and outputs a digitized rate signal; and
a digital signal processor configured to receive the digitized rate signal from the sense channel ADC and the digitized drive signal from the drive channel ADC and subtracts an in-phase component of the digitized drive signal from an in-phase component of the digitized rate signal to generate a sense axis output signal.

11. The system of claim 10, wherein the PLL includes a PLL controller and an amplitude regulator, and
wherein the PLL controller receives the digitized drive signal from the drive channel ADC and outputs a clock control signal.

12. The system of claim 11, wherein the amplitude regulator receives the digitized drive signal from the drive channel ADC and outputs the drive signal to the drive axis.

* * * * *